United States Patent [19]
Watanabe et al.

[11] Patent Number: 4,943,745
[45] Date of Patent: Jul. 24, 1990

[54] DELAY CIRCUIT FOR SEMICONDUCTOR INTEGRATED CIRCUIT DEVICES

[75] Inventors: Yohji Watanabe, Kawasaki; Takashi Ohsawa, Yokohama, both of Japan

[73] Assignee: Kabushiki Kaisha Toshiba, Kawasaki, Japan

[21] Appl. No.: 437,294

[22] Filed: Nov. 16, 1989

Related U.S. Application Data

[63] Continuation of Ser. No. 275,386, Nov. 23, 1988, abandoned.

[30] Foreign Application Priority Data

Nov. 25, 1987 [JP] Japan ................... 62-296816

[51] Int. Cl.$^5$ ........................................... H03K 5/159
[52] U.S. Cl. .................................. 307/603; 307/605; 307/608; 307/591; 307/597; 328/55; 328/66
[58] Field of Search ............... 307/603, 605, 608, 591, 307/597; 328/55, 66

[56] References Cited

U.S. PATENT DOCUMENTS

| | | | |
|---|---|---|---|
| 3,541,352 | 11/1970 | Merrill et al. | 307/603 |
| 3,569,842 | 3/1971 | Schroyer | 307/603 |
| 3,675,047 | 7/1972 | Vahlstrom et al. | 307/602 |
| 4,137,503 | 1/1979 | Ziesmer | 328/55 |
| 4,584,494 | 4/1986 | Arakawa et al. | 307/603 |
| 4,651,270 | 3/1987 | Edwards | 307/597 |
| 4,710,654 | 12/1987 | Saitoh et al. | 307/608 |

OTHER PUBLICATIONS

Sakamoto, H.: Timing Generator: in: Motorola, Technical Developments, vol. 6, Oct. 1986; pp. 26 to 27.

Primary Examiner—Andrew J. James
Assistant Examiner—Trong Quang Phan
Attorney, Agent, or Firm—Oblon, Spivak, McClelland, Maier & Neustadt

[57] ABSTRACT

A delay circuit for an IC device is disclosed, which comprises a charging/discharging circuit, a voltage divider and a comparator. The charging/discharging circuit selectively effects a charging/discharging operation in response to an input sigal to thereby generate a variable output voltage. The voltage divider divides a source voltage of the IC device to provide a reference voltage having a predetermined constant potential. The comparator is coupled to the charging/discharging circuit and voltage divider at its inverting input and non-inverting input, respectively, and compares the output voltage of the charging/discharging circuit with the reference voltage. A switch circuit is provided which performs a switching operation in response to the input signal to thereby electrically disconnect the non-inverting input of the comparator from the voltage divider. A capacitor is provided which retains the reference voltage at the non-inverting input of the comparator while the comparator is electrically disconnected from the voltage divider.

28 Claims, 3 Drawing Sheets

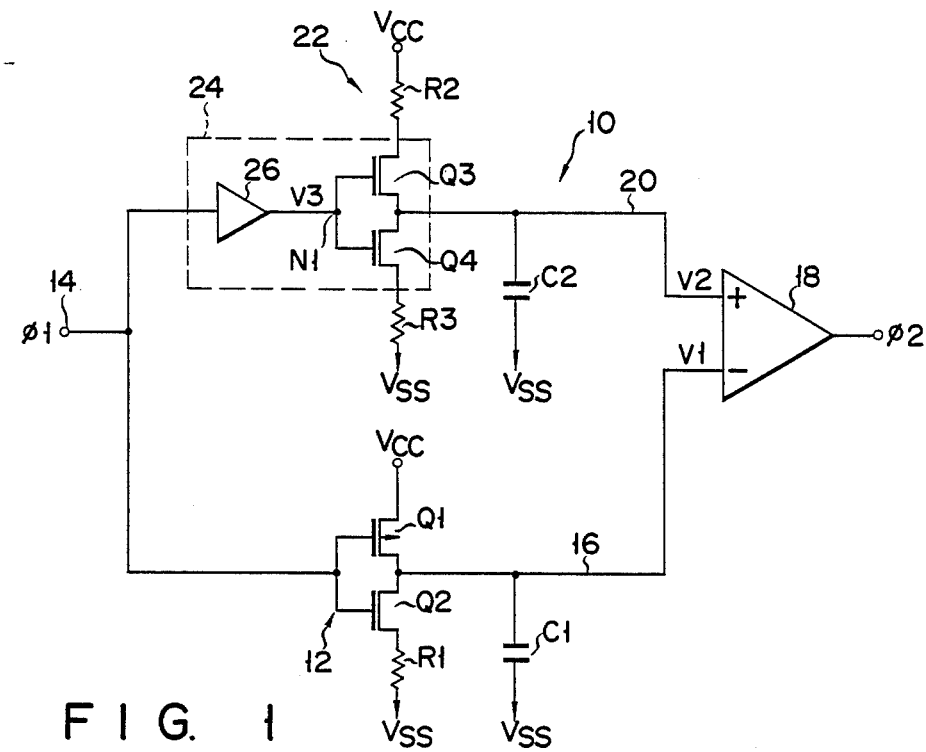
F I G. 1
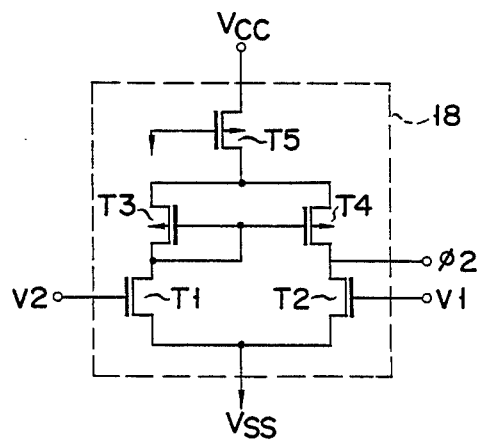
F I G. 2

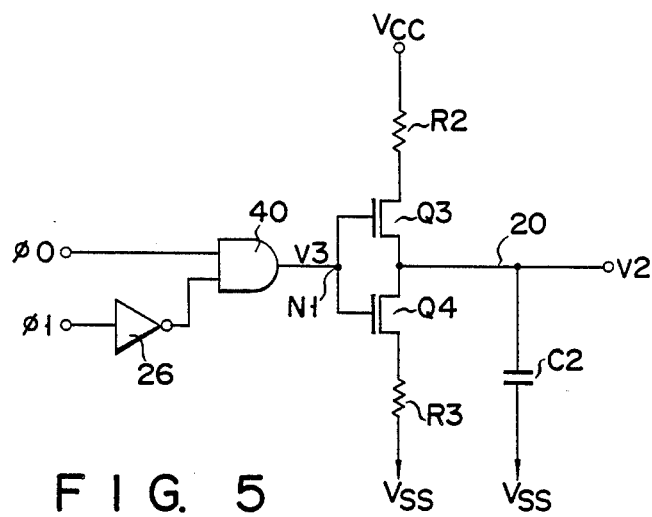
F I G. 5
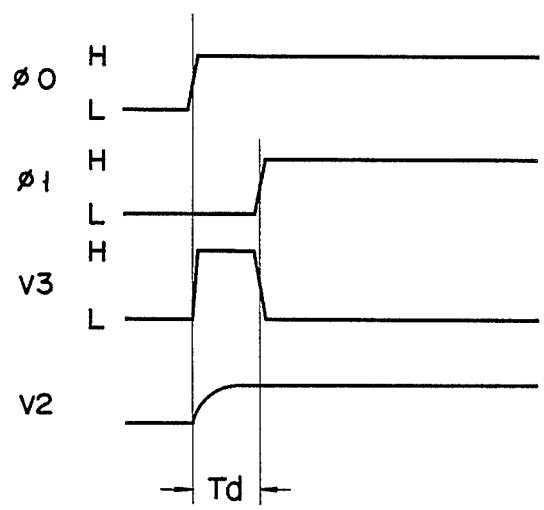
F I G. 6

DELAY CIRCUIT FOR SEMICONDUCTOR INTEGRATED CIRCUIT DEVICES

This application is a continuation of application Ser. No. 275,386, filed on Nov. 23, 1988, now abandoned.

Background of the Invention

1. Field of the Invention

The present invention relates to a delay circuit, and more particularly, to a delay circuit for preferable use in semiconductor integrated circuit (IC) devices, such as dynamic random access memories (dRAM's).

2. Description of the Related Art

Generally, IC devices such as dRAM's include a delay circuit for properly setting the internal timings in order to provide the proper synchronized operations between internal circuit sections. A conventional delay circuit is arranged to include a charging/discharging circuit supplied with an input signal $\phi 1$, a reference voltage generator and a voltage comparator for detecting the potential difference between the former two elements. When the level of the input signal $\phi 1$ changes, for example, from "L" level to "H" level, the capacitor potential of the charging/discharging circuit varies accordingly. When a node voltage coupled to the variable capacitor potential becomes equal to a constant reference voltage, the output voltage $\phi 2$ of the comparator is inverted. Therefore, it may be considered that the input signal $\phi 1$ is delayed by the interval (delay time $\tau$ between the supply of the input signal and the inversion of the output voltage $\phi 2$ of the comparator. Since this delay time $\tau$ can be arbitrarily set to the desired value by properly designing the circuit constants of the capacitor and resistors, it can be set to the proper value for each IC device.

The conventional delay circuit, however, has a shortcoming such that the delay time $\tau$ which should be constant may vary by generation of noise originated in a change in source voltage Vcc. The power lines and ground potential lines of an IC device to which the delay circuit is applied are generally shared by a plurality of internal circuit sections of the IC device, various noises are likely to occur in these lines. The generation of noise changes either one or both of the source voltage Vcc and ground potential Vss in these lines in the form of AC current. In a dRAM, in particular, charging/discharging of a number of bit lines is executed in a short range at the time of data accessing, a potential change in the power lines of the dRAM is prominent. The potential variation in the power lines renders the node voltage of the charging/discharging circuit of the delay circuit unstable, making the inversion timing of the output voltage $\phi 2$ of the comparator unstable. This makes significantly difficult to stably maintain the delay time $\tau$ at the desired, designed value.

SUMMARY OF THE INVENTION

It is therefore an object of the present invention to provide a new and improved delay circuit which can maintain constant a delay time of a semiconductor integrated circuit even when the source voltage of the circuit varies.

In accordance with the above object, this invention is addressed to a specific delay circuit for an IC device, which comprises a charging/discharging circuit, a voltage divider and a comparator. The charging/discharging circuit receives an input signal ($\phi 1$) and and selectively effects charging/discharging in response to the input signal ($\phi 1$) to thereby generate a variable output voltage. The voltage divider receives the source voltage of the IC device and divides it to provide a reference voltage having a predetermined constant potential. The comparator is coupled to the charging/discharging circuit and voltage divider at its first and second inputs, respectively, and compares the output voltage of the charging/discharging circuit with the reference voltage. A switch circuit is provided which receives the input signal ($\phi 1$) and performs a switching operation in response to the input signal ($\phi 1$) to thereby electrically disconnect the second input of the comparator from the voltage divider. A capacitor is provided which retains the reference voltage at the second input of the comparator while the comparator is electrically disconnected from the voltage divider.

This invention and its objects and advantages will become more apparent from the following detailed description of a preferred embodiment.

BRIEF DESCRIPTION OF THE DRAWINGS

In the detailed description of a preferred embodiment of the invention presented below, reference is made to the accompanying drawings in which:

FIG. 1 is a diagram illustrating the circuit configuration of a delay circuit according to one preferred embodiment of this invention;

FIG. 2 is a diagram illustrating the internal circuit configuration of a CMOS current mirror type differential amplifier serving as a voltage comparator provided in the delay circuit of FIG. 1;

FIG. 5 is a diagram illustrating the essential circuit configuration of a modification of the delay circuit of FIG. 1; and FIG. 6 is a diagram illustrating the waveforms of major signals generated in essential sections of the delay circuit of FIG. 5.

DETAILED DESCRIPTION OF THE PREFERRED EMBODIMENT

Figure 3:
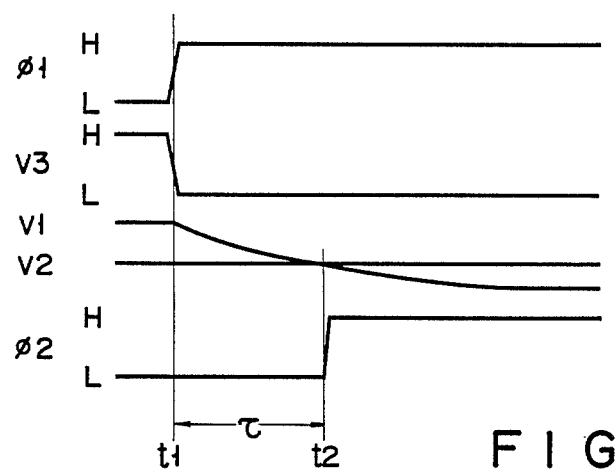
FIG. 3 is a diagram illustrating waveforms of major signals generated in essential sections of the delay circuit of FIG. 1.

Referring now to FIG. 1, a delay circuit according to a preferred embodiment of the invention is generally designated by reference numeral "10." Delay circuit 10 is built in a dRAM (not shown) and includes a charging/discharging circuit 12 which is constituted by two MOS type field effect transistors (hereinafter referred to as "MOSFET's" or simply as "FET's"), namely p-channel MOSFET Q1 and n-channel MOSFET Q2, a resistor R1 and a capacitor C1. The common gate node of FET's Q1 and Q2 is coupled to an input terminal 14 to which an input signal $\phi 1$ is supplied. Capacitor C1 is provided between a ground potential Vss and a first signal line 16 coupled to the drain node of FET's Q1 and Q2. The potential on first signal line 16 is denoted by "v1."

A voltage comparator 18 is coupled at its inverting input to signal line 16 and at its non-inverting input to a second signal line 20 to which a reference voltage generator 22 is coupled. The reference voltage generator 22 may be a voltage divider which is constituted by a series circuit of resistors R2 and R3 provided between the source voltage Vcc and ground potential Vss. This voltage divider performs the ordinary voltage dividing operation to divide the source voltage Vcc applied to one resistor R2 in accordance with the resistor ratio of R2 to R3 and supply the divided voltage to signal line 20 as a reference voltage to be supplied to the non-inverting input of comparator 18.

Comparator 18 may be a CMOS current mirror type differential amplifier constituted by five FET's T1 to T5, as shown in FIG. 2. The gates of FET's T1 and T2 respectively serve as the non-inverting input and inverting input of comparator 18. FET's T1 and T2 have sources coupled to the ground potential Vss. The common node of FET's T2 and T4 serves as the output of comparator 18 from which an output voltage $\phi 2$ is produced. FET's T3 and T4 have their sources coupled together to the source voltage Vcc through FET T5.

The present delay circuit 10 is featured in that a switch circuit 24 is provided between resistors R2 and R3 of voltage divider 22, as shown in FIG. 1. More specifically, switch circuit 24 includes a series circuit of two FET's Q3 and Q4, the former FET being provided between resistor R2 and signal line 20 and the latter between signal line 20 and resistor R3. When these FET's Q3 and Q4 are rendered conductive, resistors R2 and R3 are electrically coupled to signal line 20, whereby voltage divider 22 performs the ordinary operation to apply a divided voltage to line 20. When FET's Q3 and Q4 are rendered nonconductive, on the other hand, resistors R2 and R3 are disconnected from line 20, thus rendering line 20 as electrically floating. FET's Q3 and Q4 have their gates coupled together, and an inverter 26 is coupled between their common gate node N1 and input terminal 14 of delay circuit 10. The voltage at this node N1 is denoted by "v3."

As shown in FIG. 1, an additional capacitor C2 is coupled between line 20 and ground potential Vss. The capacitance of capacitor C2 is preferably set in such a way as to make the ratio of this capacitance to the parasitic capacitance of signal line 20 equal to the ratio of the capacitance of capacitor C1 to the parasitic capacitance of signal line 16.

Figure 4:
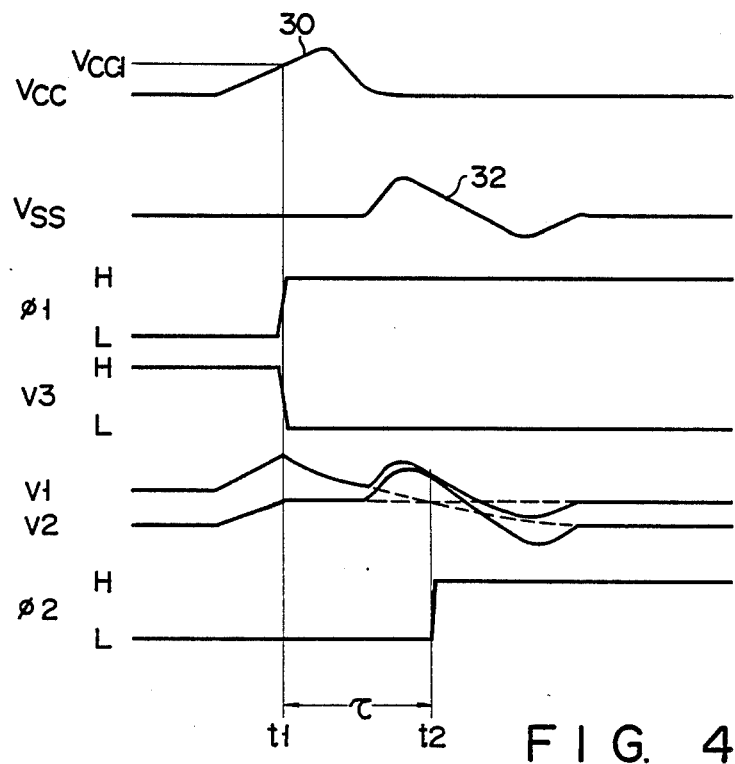
FIG. 4 is a diagram illustrating waveforms of major signals generated in essential sections of the delay circuit of FIG. 1 in a case where noise is applied to the source voltage and ground potential.

Referring to FIGS. 3 and 4, a description will be given below of the operation modes of thus constituted delay circuit 10. In the following description, the basic operation of delay circuit 10 will be described first referring to FIG. 3, followed by the explanation of the signal delay operation of delay circuit 10, with reference to FIG. 4, in the case where a potential change occurs between the source voltage Vcc and ground potential Vss of a dRAM to which this delay circuit is applied.

While the input signal $\phi 1$ has a "L" level, p-channel FET Q1 of charging/discharging circuit 12 is rendered conductive and n-channel FET Q2 nonconductive. Therefore, the source voltage Vcc is applied through FET Q1 to capacitor C1 and the corresponding charges are accumulated in the capacitor C1. At this time, the potential on signal line 20 is set to the reference voltage generated by reference voltage generator 22 since inverter 26 of switch circuit 24 generates an output voltage of "H" level and FET's Q3 and Q4 are rendered conductive in response to this output voltage, thereby coupling the voltage divider constituted by resistors R2 and R3 to line 20. The potential v2 on line 20 is expressed as:

$$v2 = Vcc \cdot R3/(R2+R3) \ldots \quad (1)$$

Since the output voltage of charging/discharging circuit 12, i.e., the potential v1 on line 16, is higher than the reference voltage or the potential v2 on line 20, the output voltage of comparator 18 has an "L" level.

As shown in FIG. 3, when the input signal $\phi 1$ changes its level from the "L" level to "H" level at time t1, p-channel FET Q1 of charging/discharging circuit 12 is rendered nonconductive whereas n-channel FET Q2 is rendered conductive. Consequently, the charges accumulated in capacitor C1 are discharged through FET Q2 and resistor R1. This gradually reduces the potential v1 on signal line 16 (i.e., the output voltage of charging/discharging circuit 12), as shown in FIG. 3. Provided that the ON resistance of FET Q2 is sufficiently smaller than the resistance of resistor R1, the output voltage v1 of charging/discharging circuit 12 may be expressed as:

$$v1(t) = Vcc \cdot e^{-t/C1 \cdot R1} \ldots \quad (2)$$

When the voltage v1 gradually decreasing becomes the reference voltage v2 at time t2, the output voltage of comparator 18 changes its level from the "L" level to the "H" level, as shown in FIG. 3. The interval between times t1 and t2, or a delay time $\tau$, may be expressed as:

$$\tau = C1 \cdot R1 \cdot \ln(1 + R2/R3) \ldots \quad (3)$$

A change in level of the output voltage $\phi 2$ is delayed by the time $\tau$ from the point of time at which the potential level of the input signal $\phi 1$ has changed; the delay time $\tau$ can be arbitrarily set by varying the CR time constant of charging/discharging circuit 12. In other words, the input signal $\phi 1$ is delayed by the time $\tau$ to be the output voltage $\phi 2$ of delay circuit 10.

It should be noted that when the input signal $\phi 1$ rises to the "H" level, the output voltage v3 of inverter 26 has the "L" level so that FET's Q3 and Q4 of switch circuit 24 are simultaneously rendered conductive. This electrically disconnects voltage-dividing resistors R2 and R3 of voltage divider 22 from each other. At the same time, line 20 coupled to the non-inverting input of comparator 18 is electrically disconnected or insulated from resistors R2 and R3, so that this line 20 becomes electrically floating while retaining the reference voltage v2 thereon. As the reference voltage v2 is constantly maintained by capacitor C2, the potential on line 20 is set to the reference voltage v2.

With such an arrangement, even when a change occurs in the source voltage Vcc or ground potential Vss or both, the potential on line 20 is free of the potential change, thus ensuring constant supply of a stable reference voltage v2 to comparator 18. Accordingly, it is possible to surely prevent the delay time $\tau$ from being unstable due to a change in source voltage Vcc. This improves the reliability of the delay time $\tau$. Further, the delay circuit of this invention is designed such that when line 20 is disconnected from voltage-dividing resistors R2 and R3, these resistors are insulated from each other. It is therefore possible to completely cut off a current flowing through voltage divider 22. This can make the series circuit of resistors R2 and R3 completely insensitive with respect to a change in source voltage Vcc as well as can reduce the dissipation power of the voltage divider.

A detailed description will now be given of the operation of the present delay circuit 10 in the case where the source voltage Vcc or ground potential Vss varies. Let us consider the case where, as shown in FIG. 4, the source voltage Vcc is changing to have an undesirably-increased potential level Vcc1 as indicated by reference numeral "30" before the input signal $\phi1$ changes from the "L" level to the "H" level at time t1. Under this circumstance, the changed source voltage Vcc1 is applied to capacitor C1 of charging/discharging circuit 12, the potential of capacitor C1 gradually decreases from this voltage Vcc1 at the time the discharging starts at time t1. Once the discharging has started, FET Q1 is rendered nonconductive as mentioned earlier to thereby insulate capacitor C1 from the source voltage Vcc, so that capacitor C1 is no longer adversely influenced by the above voltage noise. The reference voltage v2 on line 20 is also undesirably increased when line 20 is electrically floating at time t1 due to division of the source voltage Vcc varied prior to time t1. The reference voltage v2' in this case is expressed as:

$$v2' = Vcc1 \cdot R3/(R2+R3) \ldots \qquad (4)$$

After time t1, voltage-dividing resistors R2 and R3 are insulated from each other to disconnect voltage divider 22 as well as insulate line 20 from these resistors R2 and R3. Accordingly, line 20 is free of the adverse influence of the aforementioned change in source voltage. Even upon occurrence of a change in source voltage Vcc, therefore, the interval between the potential changing time t1 of the input signal $\phi1$ and the potential changing time t2 of the output voltage $\phi2$, i.e., the delay time $\tau$, is kept unchanged.

Let us now consider the case where noise 32 is generated in the ground potential Vss after time t1. In this case, as capacitors C1 and C2 are so set as to satisfy the aforementioned relationship, potential changes occurring in both lines 16 and 20 due to the capacitor coupling caused by the application of ground potential noise 32 to these lines 16 and 20 are equal to each other. It is therefore possible to provide delay circuit 10 which is insensitive to a short-range potential change in source voltage Vcc and/or ground potential Vss. This delay circuit 10 is considered particularly suitable for IC devices such as dynamic random access memories.

The above embodiment may be modified as shown in FIG. 5 wherein an AND gate 40 is additionally provided between the common gate node N1 of FET's Q3 and Q4 of switch circuit 24 and inverter 26. AND gate 40 externally receives a control signal $\phi0$ at its first input and receives the input signal $\phi1$ at its second input. As shown in FIG. 6, the control signal $\phi0$ changes its level from the "L" level to the "H" level before the level of the input signal $\phi1$ changes from the "L" level to the "H" level. The time difference between the occurrences of the change in level of the control signal $\phi0$ and the input signal $\phi1$ is denoted by "Td." Accordingly, the output voltage signal of inverter 26 is permitted to be supplied through AND gate 40 to the common gate node of FET's Q3 and Q4 only by the time Td. Therefore, the common gate node N1 is supplied with the "H" level voltage only during the time Td and FET's Q3 and Q4 are rendered nonconductive only during the same time Td. The time Td is set to have such a minimum necessary time interval as to set the voltage v2 divided on line 20 by applying the source voltage Vcc on signal line 20 through voltage divider 22 and charging capacitor C2.

With such an arrangement, voltage divider 22 is rendered operative only during a relatively short time, Td, before the input signal $\phi1$ changes its level from the "L" level to the "H" level, and it is rendered inoperative immediately upon elapse of the time Td. It is therefore possible to minimize the occurrence of a leak current or a through current. This can reduce the resistances of voltage-dividing resistors R2 and R3. Accordingly, it is possible to keep signal line 20 at the divided voltage v2 with the reduced impedance until charging/discharging in signal line 16 actually starts.

Although the invention has been described with reference to a specific embodiment, it shall be understood by those skilled in the art that numerous modifications may be made which are within the spirit and scope of the inventive contribution.

For instance, although capacitors C1 and C2 respectively coupled to first and second signal lines 16 and 20 are both coupled to a low source voltage, i.e., ground potential Vss, in the above embodiments, the delay circuit may be so designed as to permit these capacitors to be coupled to a high source voltage, i.e., source voltage Vcc. Moreover, although a CR delay circuit configuration employing a linear resistor R and a linear capacitor C is disclosed in the foregoing, a MOSFET may replace resistor R1 of charging/discharging circuit 12. In this case, the resultant delay circuit would have the proper source voltage dependent and temperature dependent characteristics.

What is claimed is:

1. A delay circuit for a semiconductor integrated circuit device, comprising:
   (a) first circuit means for receiving an input signal and for selectively executing charging/discharging in response to said input signal to thereby produce a variable output voltage;
   (b) second circuit means for receiving a source voltage of said device and for dividing said source voltage to thereby produce a voltage having a predetermined constant potential as a reference voltage;
   (c) third circuit means, having first and second inputs respectively coupled to said first and second circuit means, for comparing said output voltage of said first circuit means with said reference voltage;
   (d) fourth circuit means for receiving said input signal and performing a switching operation in response to said input signal to electrically disconnect said second input of said third circuit means from said second circuit means; and
   (e) fifth circuit means for maintaining said reference voltage at said second input of said third circuit means while said third circuit means is being disconnected from said second circuit means.

2. The circuit according to claim 1, wherein said second circuit means comprises first and second resistors coupled in series with each other for dividing said source voltage by a predetermined dividing ratio.

3. The circuit according to claim 2, wherein said fourth circuit means comprises transistor means, provided between said first and second resistors, for changing a voltage division ratio of said first and second resistors thereof in response to said input signal.

4. The circuit according to claim 3, wherein said transistor means, when rendered nonconductive, electrically disconnects said first and second resistors from said third circuit means.

5. The circuit according to claim 4, wherein said transistor means comprises a series circuit of two transistors having gate electrodes coupled together.

6. The circuit according to claim 5, wherein said fourth circuit means further comprises an inverter coupled to said gate electrodes of said two transistors, whereby said input signal is supplied through said inverter to said gate electrodes of said two transistors.

7. The circuit according to claim 6, wherein said fifth circuit means comprises a capacitor coupled to said second input of said third circuit means.

8. A delay circuit comprising:
   (a) charging/discharging circuit means for receiving an input signal and for producing an output voltage in response to said input signal;
   (b) voltage divider means for receiving a source voltage and dividing said source voltage to provide a reference voltage having a constant potential level, said voltage divider means having first and second resistors coupled in series with each other;
   (c) comparator means, having an inverting input coupled through a first signal line to said charging/discharging circuit means and a non-inverting input coupled through a second signal line to said voltage divider means, for comparing said output voltage of said charging/discharging circuit means with said reference voltage;
   (d) switch circuit means, provided between said first and second resistors in said voltage divider means, for receiving said input signal and being rendered selectively nonconductive in response to said input signal to electrically disconnect said first and second resistors from each other and disconnect said second signal line from said first and second resistors, thereby rendering said second signal line electrically floating; and
   (e) voltage keeping means, coupled to said second signal line, for receiving said reference voltage to be charged when said switch circuit means is rendered conductive, and for maintaining said reference voltage on said second signal line when said switch circuit means is rendered non conductive..

9. The circuit according to claim 8, wherein said switch circuit means comprises:
   a first transistor provided between said first resistor and said second signal line; and
   a second transistor provided between said second signal line and said second resistor, said first and second transistors being rendered nonconductive substantially simultaneously.

10. The circuit according to claim 9, further comprising:
   (f) control means, coupled to said switch circuit means, for rendering said switch circuit means conductive only during a predetermined time interval prior to occurrence of a change in level of said input signal.

11. The circuit according to claim 10, wherein said charging/discharging circuit means comprises:
   a first capacitor, coupled to said first signal line, for selectively receiving said source voltage to execute a charging operation; and
   a third resistor selectively coupled to said first capacitor, said first capacitor being discharged through said third resistor.

12. The circuit according to claim 11, wherein said voltage keeping means comprises a second capacitor coupled to said second signal line.

13. The circuit according to claim 12, wherein said second capacitor has a specific capacitance which is so determined as to make a ratio of a capacitance of said first capacitor to a parasitic capacitance of said first signal line equal to a ratio of a capacitance of said second capacitor to a parasitic capacitance of said second signal line.

14. The circuit according to claim 13, wherein said first and second transistors have gate electrodes coupled together, and wherein said switch circuit means further comprises an inverter coupled to said gate electrodes of said first and second transistors, said input signal being supplied through said inverter to said gate electrodes of said first and second transistors.

15. The circuit according to claim 14, wherein said control means comprises an AND gate circuit provided between said inverter and said gates electrodes of said first and second transistors.

16. The circuit according to claim 15, wherein said comparator means includes a CMOS current mirror type differential amplifier.

17. A delay circuit for a semiconductor integrated circuit device, comprising:
   charging/discharging means for receiving an input signal and for producing a variable output signal in response to the input signal;
   voltage-divider means for receiving a first voltage and for producing a reference voltage having a constant potential level;
   comparator means having a first input (−) connected to said charging/discharging means and a second input (+) connected to said voltage-divider means, for comparing the output voltage of said charging/discharging means with the reference voltage;
   said charging/discharging means including a first capacitor connected to a second voltage and said first input;
   switching means for electrically separating said second input of said comparator means from said voltage-divider means in response to said input signal; and
   a second capacitor connected to said second voltage and said second input of said comparator means.

18. The circuit according to claim 17, wherein one of the first and second voltages is a power supply voltage of the semiconductor integrated circuit device.

19. The circuit according to claim 18, further comprising:
   first conductor means for supplying the output voltage of said charging/discharging means to said first input (−) of said comparator means;
   second conductor means for supplying said reference voltage to said second input (+) of said comparator means;
   said first capacitor being connected to said first conductor means; and
   said second capacitor means being connected to said second conductor means.

20. The circuit according to claim 19, wherein said switching means comprises a transistor connected to said second conductor means.

21. The circuit according to claim 19, wherein said switching means comprises transistors connected to said second conductor means.

22. The circuit according to claim 19, wherein said switching means comprises a series circuit of transistors having gate electrodes connected to each other.

23. The circuit according to claim 22, wherein said switching means further comprises an inverter having an input for receiving said input signal and an output connected to said gate electrodes of said transistors.

24. The device according to claim 19, wherein said first input of said comparator means is an inverting input, and said second input of said comparator is a non-inverting input.

25. A delay circuit comprising:
a charging/discharging circuit connected between a first power supply voltage and a second power supply voltage, said charging/discharging circuit comprising a first capacitor;
a reference voltage generation circuit connected between the first and second voltages, for generating a constant voltage;
a comparator having an inverting input connected to said charging/discharging circuit and a non-inverting input connected to said reference voltage generation circuit;
switching means for selectively disconnecting said comparator from said reference voltage generating circuit;
a second capacitor connected to said non-inverting input of said comparator; and
said first and second capacitors being connected to one of said first and second voltages.

26. The circuit according to claim 25, wherein said reference voltage generation circuit comprises a voltage-divider circuit having resistors.

27. The circuit according to claim 26, wherein said switching means comprise transistors for electrically separating said resistors from each other and for electrically separating the non-inverting input of said comparator from said resistors of said voltage divider circuit.

28. The circuit according to claim 27, wherein said charging/discharging circuit further comprises a resistor connected in parallel with said first capacitor.

* * * * *